(12) United States Patent
Eisele et al.

(10) Patent No.: US 9,312,397 B2
(45) Date of Patent: Apr. 12, 2016

(54) TRANSISTOR STRUCTURE, METHOD FOR MANUFACTURING A TRANSISTOR STRUCTURE, FORCE-MEASURING SYSTEM

(71) Applicant: Fraunhofer-Gesellschaft zur Foerderung der angewandten Forschung e.V., Munich (DE)

(72) Inventors: Ignaz Eisele, Icking (DE); Martin Heigl, Weiden (DE); Karl Haberger, Martinsried (DE)

(73) Assignee: Fraunhofer-Gesellschaft zur Foerderung der angewandten Forshung e.V., Munich (DE)

( * ) Notice: Subject to any disclaimer, the term of this patent is extended or adjusted under 35 U.S.C. 154(b) by 417 days.

(21) Appl. No.: 13/722,422

(22) Filed: Dec. 20, 2012

(65) Prior Publication Data

US 2013/0153970 A1 Jun. 20, 2013

(30) Foreign Application Priority Data

Dec. 20, 2011 (DE) .......................... 10 2011 089 261

(51) Int. Cl.
*H01L 29/84* (2006.01)
*H01L 21/02* (2006.01)
*H01L 29/78* (2006.01)
*B81B 1/00* (2006.01)
(Continued)

(52) U.S. Cl.
CPC . *H01L 29/84* (2013.01); *B81B 1/00* (2013.01); *B81C 1/00* (2013.01); *G01L 1/148* (2013.01); *G01L 9/0073* (2013.01); *H01L 21/02* (2013.01); *H01L 29/78* (2013.01); *H01L 29/51* (2013.01)

(58) Field of Classification Search
CPC .......... H01L 22/00; H01L 29/84; H01L 29/78
USPC ............ 438/53, 50, 73, 52; 257/415, 417, 48; 73/713–715
See application file for complete search history.

(56) References Cited

U.S. PATENT DOCUMENTS 4,411,741 A 10/1983 Janata
5,500,549 A 3/1996 Takeuchi et al.
(Continued)

FOREIGN PATENT DOCUMENTS

DE 4239319 4/1993
DE 4339190 5/1994
(Continued)

OTHER PUBLICATIONS

Boerl, S. et al., "Isotropic etching of SiGe alloys with high selectivity to similar materials", Microelectronic Engineering; Science Direct, Mar. 14, 2004, pp. 301-305.
(Continued)

*Primary Examiner* — Thomas L Dickey
(74) *Attorney, Agent, or Firm* — Michael A. Glenn; Perkins Coie LLP (57) ABSTRACT

A transistor structure includes a first terminal region, a second terminal region and a channel region therebetween in a semiconductor substrate. Additionally, the transistor structure includes a control electrode associated with the channel region, the control electrode having a control electrode portion which is elastically deflectable under the action of a force and spaced apart from the channel region. The distance between the control electrode portion and the channel region is changed based on the action of force.

4 Claims, 9 Drawing Sheets photoresist monocrystalline silicon lid

SiGe layer stack substrate (Si)

(51) Int. Cl.
  *B81C 1/00* (2006.01)
  *G01L 9/00* (2006.01)
  *G01L 1/14* (2006.01)
  *H01L 29/51* (2006.01)

(56) References Cited

U.S. PATENT DOCUMENTS

| | | | |
|---|---|---|---|
| 5,504,356 A | | 4/1996 | Takeuchi et al. |
| 5,818,093 A | * | 10/1998 | Gutteridge et al. ........... 257/417 |
| 7,625,772 B2 | * | 12/2009 | Casset et al. .................... 438/50 |
| 2003/0173611 A1 | * | 9/2003 | Bertz et al. .................... 257/302 |
| 2008/0145989 A1 | | 6/2008 | Oh et al. |

FOREIGN PATENT DOCUMENTS

| | | |
|---|---|---|
| DE | 4444149 | 6/1995 |
| GB | 439456 | 12/1935 |

OTHER PUBLICATIONS

Hoellt, Lothar et al., "Quantum-mechanical and ballistic silicon-based nano-devices", Dissertation, Bunderswehr University Munich, 2009, 181 pages.

Petersen, K. et al., "Silicon as a Mechanical Material", IEEE Transactions on Electron Devices; vol. 70, No. 5, May 1982, pp. 420-457.

* cited by examiner

TRANSISTOR STRUCTURE, METHOD FOR MANUFACTURING A TRANSISTOR STRUCTURE, FORCE-MEASURING SYSTEM

CROSS-REFERENCE TO RELATED APPLICATION

This application claims priority from German Patent Application No. 102011089261.3, which was filed on Dec. 20, 2011, and is incorporated herein by reference in its entirety.

BACKGROUND OF THE INVENTION

Embodiments of the present invention relate to a transistor structure, to a method for manufacturing a transistor structure and to a force-measuring system. In particular, embodiments of the present invention relate to a transistor structure comprising a control electrode and a control electrode portion elastically deflectable under the action of a force, which represents a so-called micromechanical system (MEMS=microelectromechanical system).

A miniaturized electromechanical element, such as, for example, a miniaturized microphone or a miniaturized sensor or actor, is an example of a micromechanical system. It is characteristic of MEMS that such electromechanical elements are manufactured directly on a semiconductor substrate on the basis of manufacturing technologies for integrated circuits and that same are integrated directly into electronics, such as, for example, an integrated circuit.

Currently available sensors on the basis of micromechanical systems include a piezoresistive, piezoelectrical or capacitive evaluating functionality, i.e. when, for example, measuring a force or measuring an acceleration, a measuring signal which is dependent on the quantity (such as, for example, force or acceleration) to be measured is based on a piezoresistive, piezoelectrical or capacitive change. In particular, piezoresistive signal collection is very common in such sensors since piezoresistive elements exhibit a high degree of compatibility towards semiconductor and silicon technologies. Piezoresistive, but also piezoelectrical or capacitive elements, however, are strongly dependent on ambient conditions, such as, for example, ambient temperature or a respective material surroundings of the micromechanical elements, which has an impact on the precision thereof.

SUMMARY

According to an embodiment, a transistor structure may have a first terminal region, a second terminal region and a channel region therebetween in a semiconductor substrate, and a control electrode associated with the channel region, the control electrode having a control electrode portion spaced apart from the channel region, which is deflectable elastically under the action of a force so as to change a distance between the control electrode portion and the channel region based on the force acting.

According to another embodiment, a method for manufacturing a transistor structure may have the steps of: producing a first terminal region, a second terminal region and a channel region therebetween in a semiconductor substrate; applying an intermediate layer having a semiconductor connection material onto the channel region in a patterned manner with a thickness such that a lattice structure of the semiconductor substrate is continued through the intermediate layer; applying a control electrode associated with the channel region onto the intermediate layer such that the lattice structure of the semiconductor substrate is continued into the control electrode; and selectively removing the intermediate layer such that a control electrode portion elastically deflectable under the action of a force is formed, wherein a distance between the control electrode portion and the channel region is changeable based on the action of the force.

According to another embodiment, a force-measuring system may have: a transistor structure as mentioned above; and evaluating means connected to the first terminal region, the second terminal region and the control electrode portion of the transistor structure, wherein the evaluating means is configured to establish a measuring signal between the first terminal region and the second terminal region, the measuring signal being dependent on a distance between the control electrode portion and the channel region and, consequently, on the action of the force on the control electrode portion.

According to another embodiment, a transistor structure may have: a first terminal region, a second terminal region and a channel region therebetween in a semiconductor substrate; and a control electrode associated with the channel region, wherein the control electrode has a control electrode portion which is elastically deflectable under the action of a force and spaced apart from the channel region, so as to change a distance between the control electrode portion and the channel region based on the action of the force, wherein the control electrode and/or the control electrode portion has a monocrystalline lattice structure.

According to another embodiment, a transistor structure may have: a first terminal region, a second terminal region and a channel region therebetween in a semiconductor substrate; and a control electrode associated with the channel region, wherein the control electrode has a control electrode portion which is elastically deflectable under the action of a force and spaced apart from the channel region, so as to change a distance between the control electrode portion and the channel region based on the action of the force, wherein the control electrode additionally has one or several control electrode bases by means of which the control electrode portion is supported on one side or on several sides as a bending bar structure opposite the semiconductor substrate, wherein the control electrode has a control electrode lid and a control electrode intermediate region, and wherein the control electrode lid and the substrate have a silicon material and the control electrode intermediate region has a silicon-germanium material.

The core of the present invention is realizing a circuit element including a mechanically movable gate structure on a substrate so as to form a "nanogap" over the channel region of a (field-effect) transistor, the gate structure comprising the same material, i.e. the same atomic lattice structure as the substrate. Due to the same atomic lattice structure of the substrate and the gate structure, these two regions exhibit identical material characteristics, such as, for example, with regard to elasticity and thermal extension, making the circuit element particularly robust against external ambient influences. The gate structure, or control electrode portion, here are associated with the channel region and separated therefrom by the nanogap such that an active device, for example for measuring a force, is formed. A change in distance of the mechanical control electrode portion movable under the action of a force or elastically deformable causes a change in a current intensity through the transistor or a change in voltage in the transistor such that the current intensity or the voltage may be tapped as a measuring signal. In correspondence with the underlying pattern of a (field-effect) transistor, changes in mass or changes in force causing a mechanical movement of the control electrode portion can be detected precisely using such a transistor structure.

Consequently, potential applications of this concept are in sensorics or sensoric elements, further alternative fields of application, such as, for example, filters, being also possible. Of advantage in this concept is the (lateral) scalability of the transistor structure. Irrespective of scaling, an easy-to-evaluate measuring signal is generated since the transistor characteristic curve including its steepness may be adjusted via the lateral dimensions (or the relative ratio of the lateral dimensions).

In correspondence with further embodiments, the present invention provides a method for manufacturing the transistor structure, comprising the steps of producing a first terminal region, a second terminal region and a channel region therebetween in a semiconductor substrate. Furthermore, the method includes the step of applying an intermediate layer, also referred to as sacrificial layer, onto the channel region in a patterned manner with a thickness such that a lattice structure of the semiconductor substrate is continued through the intermediate layer. In addition, the method includes another step of selectively removing the intermediate layer such that a control electrode portion elastically deflectable under the action of a force is formed, wherein a distance between the control electrode portion and the channel region may be changed based on the action of the force. Selectively removing may, for example, be performed by means of plasma etching, wherein silicon-germanium compounds, for example, can be etched at a higher etching rate compared to silicon-silicon compounds such that same are dissolved before silicon-silicon compounds. This effect allows removing silicon-germanium compounds at high selectivity. It is of advantage here that the manufacturing method may be integrated in a CMOS process. Another advantage of this manufacturing method is that the control electrode portion and the control electrode comprise the same atomic lattice structure (such as, for example, a monocrystalline lattice structure) as the semiconductor substrate, since the lattice structure is continued through the intermediate layer or sacrificial layer into the control electrode structure. This causes an improvement in the mechanical characteristics of the control electrode or control electrode portion, exemplarily with regard to thermal extension or elasticity behavior, which has a positive effect on the precision of the transistor structure useable for measuring purposes.

In correspondence with further embodiments, the present invention provides a force-measuring system comprising the above mentioned transistor structure and evaluating means connected to the first terminal region and the second terminal region and to the control electrode portion of the transistor structure. The evaluating means is configured to establish a measuring signal between the first terminal region and the second terminal region, said measuring signal being dependent on a distance between the control electrode portion and the channel region and, thus, on the action of a force on the control electrode portion. As already mentioned before, it is of advantage here that the measuring signal, which is dependent on the action of a force on the control electrode portion, which is nearly independent of the scaling factor of the transistor structure, may be evaluated by means of the evaluating means in a precise and refined manner.

BRIEF DESCRIPTION OF THE DRAWINGS

Embodiments of the invention will be detailed subsequently referring to the appended drawings, in which.

DETAILED DESCRIPTION OF THE INVENTION

Before embodiments of the present invention will be detailed subsequently referring to the figures, it is pointed out that same elements or elements of the same effect are provided with same reference numerals such that the description of elements of the same reference numerals is mutually applicable or exchangeable.

Figure 1A:
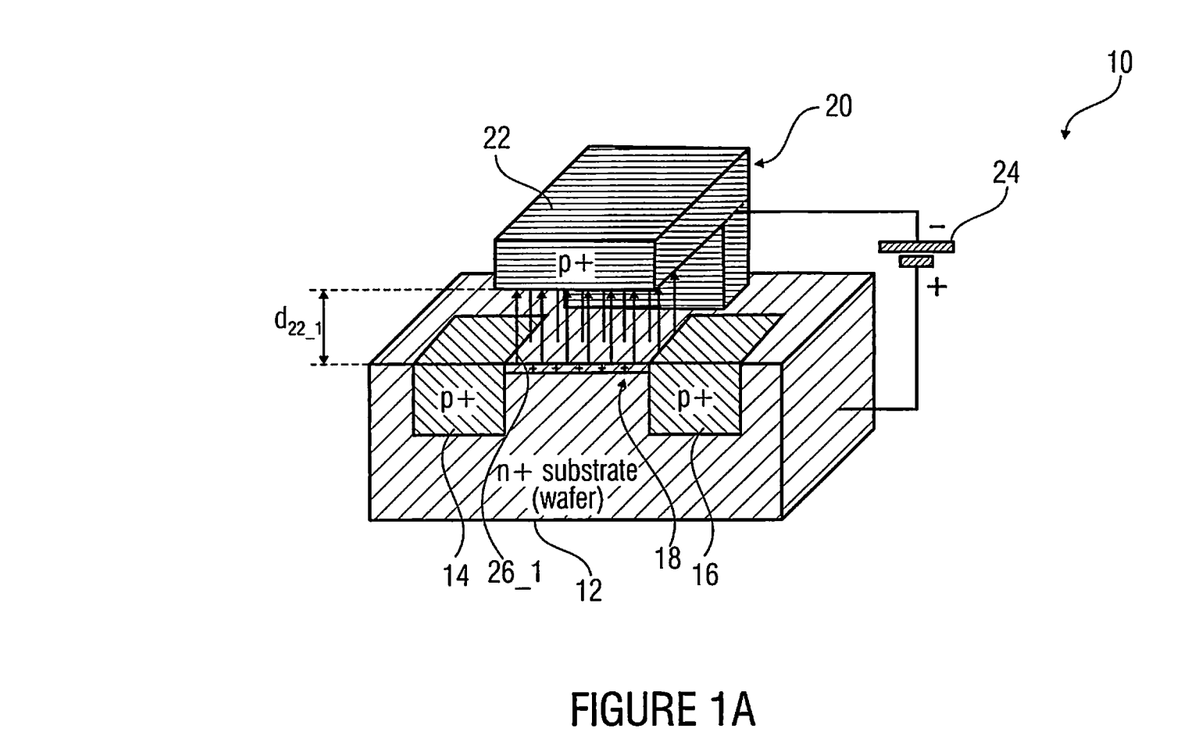
FIGS. 1a-b show schematic sectional views of a transistor structure in accordance with an embodiment with and without the action of a force.
Figure 1B:
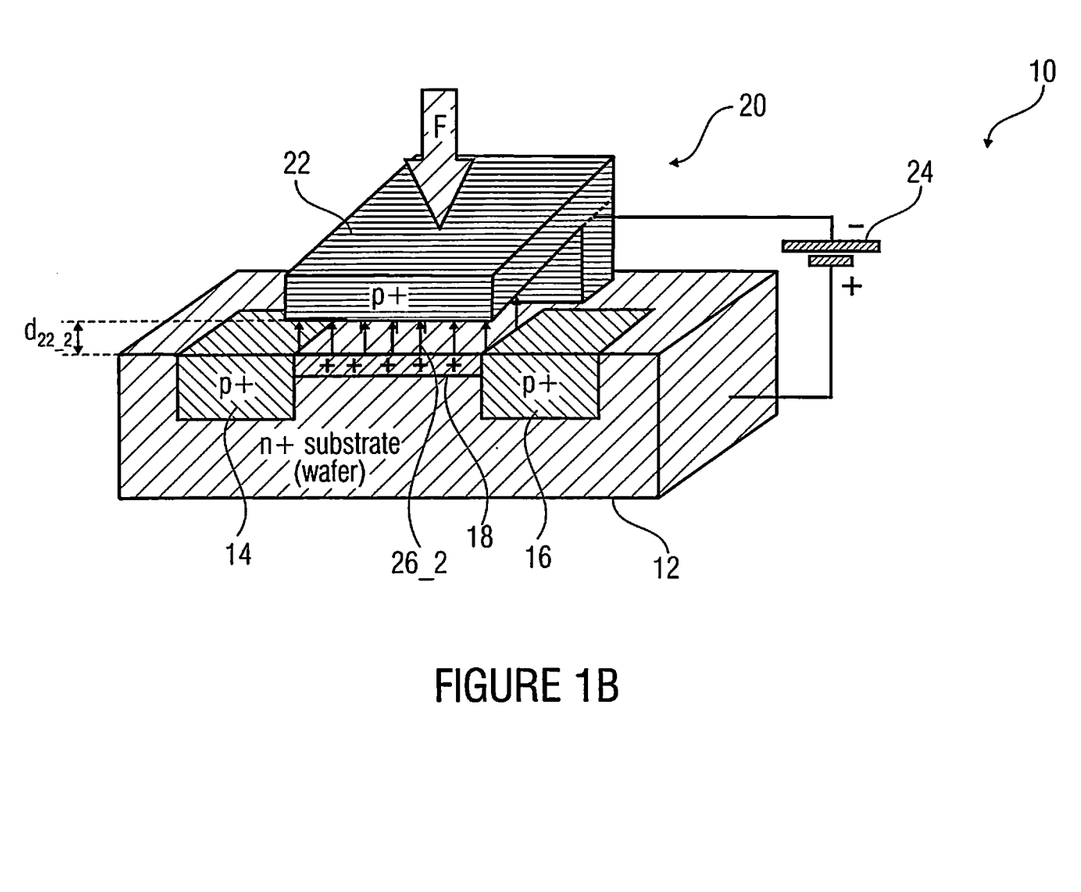

A transistor structure and, in particular, its mode of functioning will be detailed below referring to FIGS. 1a and 1b, FIG. 1a showing an unloaded transistor structure 10 (normal state) and FIG. 1b showing the same, but loaded transistor structure 10 (loaded state).

FIG. 1a shows the transistor structure 10 formed on the semiconductor substrate 12, such as, for example, a wafer of a first doping. The semiconductor substrate 12 is, for example, made of silicon having a monocrystalline atomic lattice structure. A first terminal region 14 and a second terminal regional 16 which exemplarily both comprise a second doping are formed on the semiconductor substrate 12. The first terminal region 14 and the second terminal region 16 are arranged such that a channel region 18 is formed therebetween. The length of the channel region 18 is, for example, 10 µm, wherein generally the channel length may be less than 100 µm or even less than 1 µm (i.e. in a range between 0.01 µm to 1 µm or in a range between 0.1 µm to 100 µm).

A control electrode 20 associated with the channel region 18 is arranged on the semiconductor substrate 12, wherein a control electrode portion 22 of the control electrode 20 is arranged above the channel region 18 and opposite the first main surface of the semiconductor substrate 12 in the channel region 18 in a spaced-apart manner. For this, the control electrode portion 22 is, for example, arranged in parallel to the main surface of the semiconductor substrate 12 in a distance $d_{22}$ between the control electrode portion 22 and the channel region 18, the distance $d_{22}$ typically being 20 nm (or 5 nm to 200 nm). It is mentioned here that the channel region 18 and the control electrode portion 22 may advantageously, but not necessarily exhibit equal areas. The control electrode portion 22 is elastically deformable such that the distance $d_{22}$ may change (such as, for example, distance $d_{22\_1}$ and $d_{22\_2}$). The control electrode portion 22 has a length L (such as, for example, 10 µm or 5 to 25 µm) at a width W (such as, for example, 2 µm or 0.5 µm to 10 µm). In other words, the control electrode portion 22 is formed as a mechanically movable gate of an MOS transistor and consequently represents an active element.

The control electrode 20 with its control electrode portion 22 exemplarily comprises a monocrystalline atomic lattice structure corresponding to the atomic lattice structure of the semiconductor substrate 12 and is exemplarily doped, like the terminal regions 14 and 16, using the first doping. Generally, control electrode 20 and control electrode portion 22, which is also referred to as tongue, comprise the same atomic lattice structure as the semiconductor substrate 12, offering the advantage that the control electrode 20 practically equals the semiconductor substrate 12 with regard to electrical and, above all, with regard to mechanical characteristics, such as, for example, thermal extension, mechanical parameters and temporal degradation. In correspondence with another embodiment, the control electrode structure 20 is manufactured of monocrystalline silicon exhibiting very high mechanical stability. Monocrystalline silicon is highly elastic up to the breaking point and does not exhibit material fatigue. This makes the sensor or transistor structure 10 very robust and durable. Furthermore, the thermal extension coefficient of silicon is $2.3\text{-}7.6 \times 10^{-6}$ 1/K, which, compared to other materials (such as, for example, aluminum at $23.6 \times 10^{-6}$ 1/K), results in a considerably reduced temperature dependency.

The mode of functioning of the transistor structure 10 will be described below. It is possible using the movable structure of the control electrode portion 22 to detect force influences F, exemplarily caused by accelerations, magnetic effects or mechanical pressure. These force influences F result in bending of the elastically deformable control electrode portion 22, thereby changing the distance $d_{22}$ between the control electrode portion 22 (as a gate) and the channel region 18. The transistor structure 10 shown in FIG. 1a comprising the unloaded control electrode 20 or unloaded control electrode portion 22 represents the normal state. In the unloaded control electrode portion 22, a distance $d_{22\_1}$ forms between the control electrode portion 22 and the channel region 18. A distance $d_{22\_2}$ of FIG. 1b is smaller compared to the distance $d_{22\_1}$, the smaller distance $d_{22\_2}$ resulting from loading the controlled electrode portion 22 by a force F. The control electrode portion 22 is spaced apart from the channel region 18, i.e. insulated, such that a capacity or control capacity of the transistor structure is formed. In general, it is of advantage that the distance $d_{22}$ between the control electrode portion 22 and the semiconductor substrate 12 is very small in the normal state, i.e. distance $d_{22\_1}$, such that a so-called "nanogap" is formed. This results in a greater capacity per area of the control electrode portion 22, which is the basis for a good-to-evaluate and precise measuring signal.

When applying a voltage or supply voltage (illustrated here by a direct voltage source 24) between the semiconductor substrate 12 and the control electrode portion 22 or control electrode 20, an electrical field 26 of an electrical field strength forms. The channel or charge carrier density in the channel region 18 and, consequently, the current flow between the first terminal region 14 and the second terminal region 16 can be controlled by means of the electrical field strength of the electrical field 26. An electrical field strength 26_1 is, in the normal state (compare FIG. 1a), smaller than an electrical field strength 26_2 in the loaded state (compare FIG. 1b) which results from the smaller distance $d_{22\_2}$ compared to the distance $d_{22\_1}$. Consequently, the channel in the channel region 18 in FIG. 1b is more pronounced compared to the channel in FIG. 1a such that a greater current flow forms between the first and second terminal regions 14 and 16 in the loaded state of the transistor structure 10. This stronger current flow shows as a greater current intensity compared to the normal state when a voltage is impressed between the first and second terminal regions 14 and 16, or in a greater voltage when a current intensity is impressed between the first and second terminal regions 14 and 16. This current intensity or voltage may be established as the measuring signal (exemplarily by means of evaluating means). The drain current is dependent on the area-normalized capacity $C_j$ of the capacitor formed between the control electrode portion 22 and the channel region 18 and, thus, on the force F. In other words, an external force F acting normal to the surface of the control electrode portion 22 bends the control electrode portion 22 and thus results in a reduction in the air gap or distance $d_{22}$ ($d_{22\_1}$ and $d_{22\_2}$), resulting in an increase in the capacity $C_j$ between the control electrode portion 22 and the channel region 18. As a result, a considerable shift in the so-called drain current $I_D$ forms in correspondence with the following equation:

$$I_D = \mu C_j (W_{effective}/L_{effective})(V_{GS} - V_T)V_{DS}$$

$\mu$ representing the movability of the free charge carriers in the inversion layer in the channel region 18, whereas $W_{effective}$ and $L_{effective}$ are the lateral geometrical dimensions of the transistor. $C_j$ is the capacity, normalized relative to the area, of the control electrode portion 22, $V_{GS}$ representing the voltage between the control electrode portion (gate) and the second terminal region 16 (source). $V_{DS}$ is the voltage of another external voltage supply between the first terminal region 14 (drain) and the second terminal region 16. $V_T$ is the initial voltage of inversion. In correspondence with the equation, a force F results in an increase in the current $I_D$ through the transistor structure. It is to be pointed out here that the equation applies to the linear range of the transistor 10. It is decisive here that it is not the absolute value of the capacity $C_j$, but the area-normalized capacity that is used. The area ($W_{effective} \times L_{effective}$) of the control electrode portion 22 may be scaled virtually as desired so that the relation between $W_{effective}$ and $L_{effective}$ and, thus, the ratio $W_{effective}/L_{effective}$ remain the same. This additionally results in the steepness of the characteristic curve of the transistor which may be adjusted via the ratio $W_{effective}/L_{effective}$ not to change. This connection results in a very high measuring sensitivity and measuring precision, which would not be possible when measuring the absolute value of the capacity, since typically values below 1 picofarad may only be determined at very high measuring complexity. This connection will be described below exemplarily: with a distance $d_{22}$ in the normal state of 40 nm, bending the control electrode structure 22 (bridge) by 1 nm causes a change in capacity and consequently also a change in current of 2.5%, which conversely means that even the smallest forces F can be detected. Thus, the area or lateral dimension of the sensor and the scanning principle connected thereto may be scaled, without any losses in sensitivity, until the onset of short-channel effects, i.e. up to the sub-micrometer range. Since the measuring signal does not depend on the size of the area and since only the capacity of the control electrode portion 22, normalized relative to the area, is included in the transistor characteristic curve, there is no loss in sensitivity when scaling. This transistor structure 10 allows very small structural sizes.

Figure 2A:
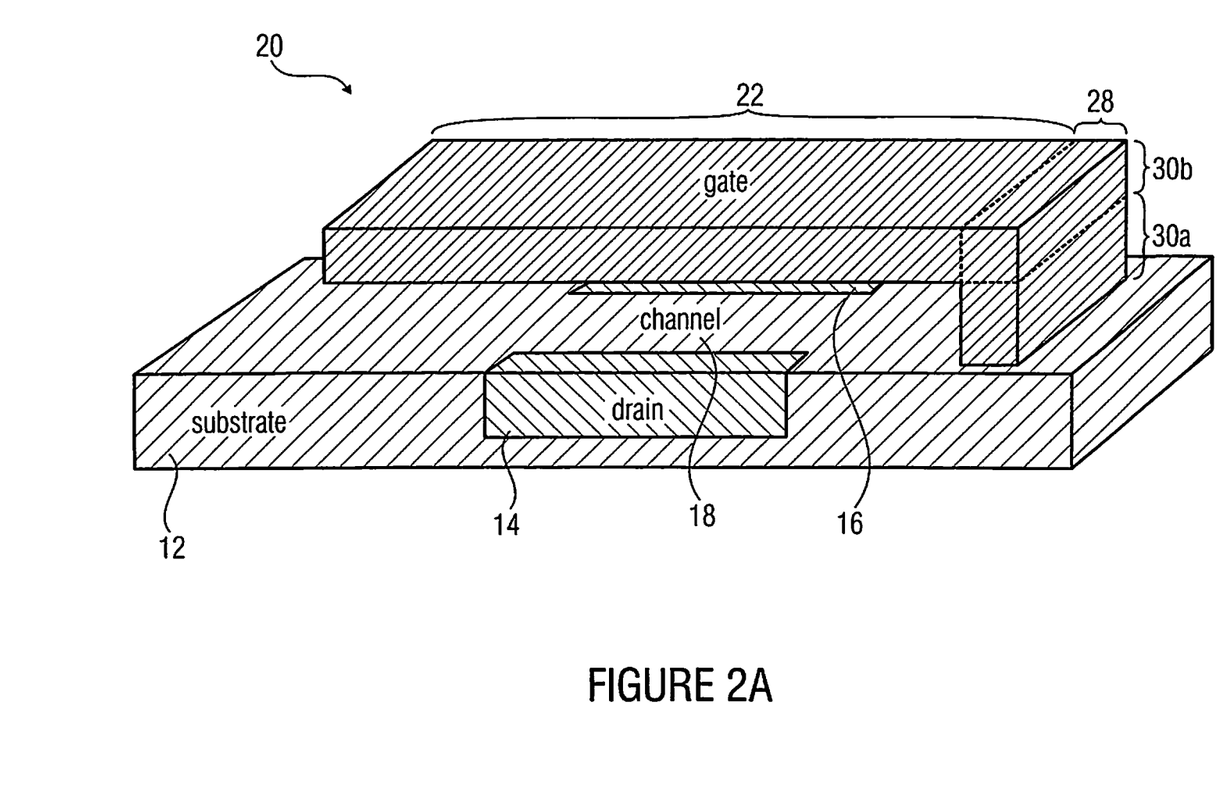
FIGS. 2a-b show schematic sectional views of embodiments of the transistor structure comprising different control electrode structures.

FIG. 2a shows another embodiment of the transistor structure comprising the semiconductor substrate 12 (including an n+ doping), a first terminal region 14, such as, for example, a drain region of a p+ doping, a second terminal region 16, such as, for example, a source region of a p+ doping, and a channel region 18 therebetween. In correspondence with the transistor structure 10, the control electrode 20, including the control electrode portion 22, which is also referred to as gate region and may be p+-doped, is formed as a cantilever structure, i.e. supported on one side. In this way, the control electrode 20 comprises the control electrode portion 22 and the control electrode base 28 which connects the control electrode portion 22 to semiconductor substrate 12. In other words, the control electrode 20 forms a bending bar structure supported on one side, having the control electrode portion 22 as a bending bar. Further sub-division of the control electrode 20 may be done in correspondence with manufacturing or individual layers, wherein the control electrode 20 then comprises a control electrode intermediate region 30a and a control electrode lid 30b. The control electrode intermediate region 30a consequently is the region of the control electrode 20 or control electrode base 28 situated between the first main surface of the semiconductor substrate 12 and the layer forming the control electrode portion 22 or control electrode lid 30b. The control electrode lid 30b is that region of the control electrode 20 which is in the level of the control electrode portion 22. In other words, the control electrode lid 30b includes the control electrode portion 22 and part of the control electrode base 28, the control electrode intermediate region 30a including the other part of the control electrode base 28.

It is mentioned here that the semiconductor substrate 12 and the control electrode lid 30b exemplarily comprise silicon, whereas the control electrode intermediate region 30a may, caused by manufacturing, comprise a small germanium content, such as, for example, up to 10% (or even up to 30% or in a range from 5% to 15%), however, the atomic lattice structure in all three regions mentioned being the same.

Figure 2B:
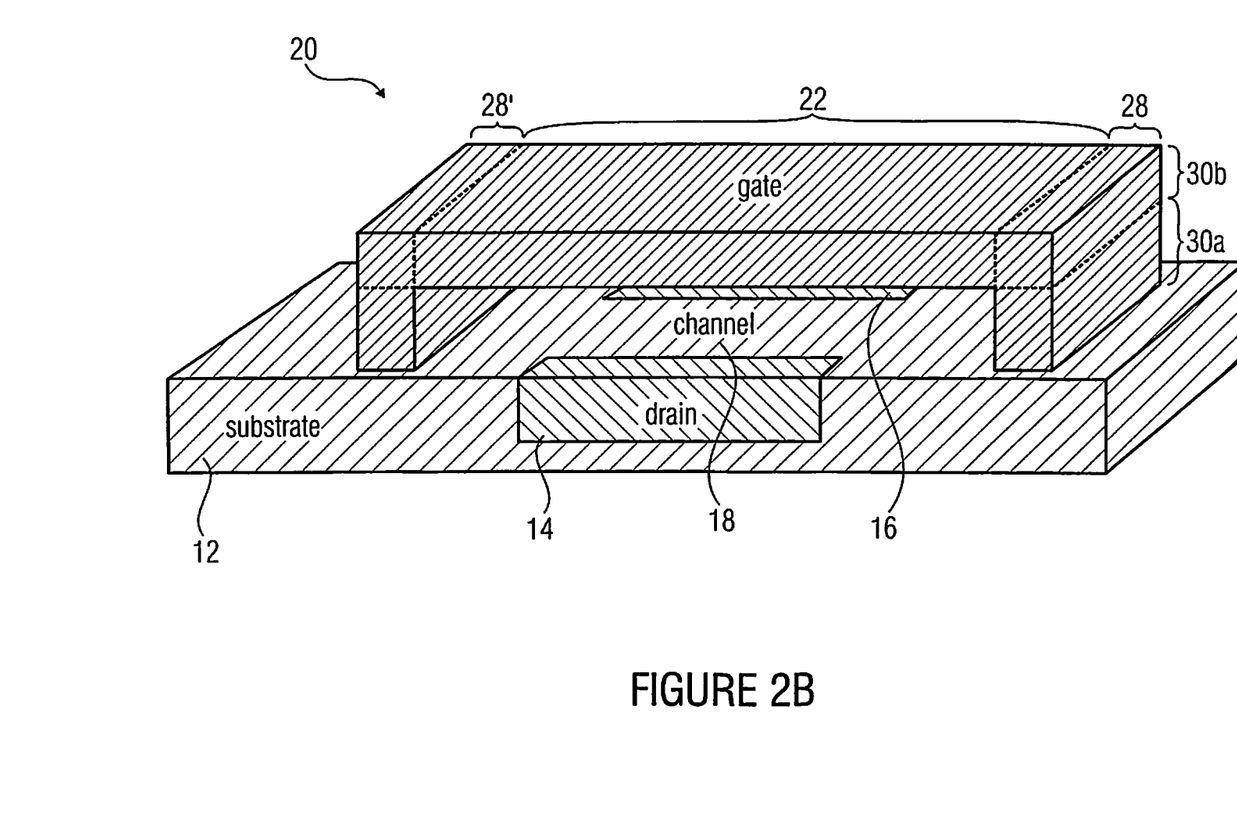

FIG. 2b shows another embodiment of the transistor structure, corresponding to the transistor structure of FIG. 2a, however comprising a second control electrode base 28'. The second control electrode base 28' is arranged on a second side of the channel region, i.e. opposite the first control electrode base 28, such that the control electrode 20 is formed as a bridge structure and the control electrode portion 22 is supported on two sides. Thus, the control electrode 20 forms a bending bar structure, supported on two sides, having the control electrode portion 12 as the bendable region or bending bar. In correspondence with the alternative subdivision, part of the second control electrode base 28' is consequently formed by the control electrode intermediate region 30a, whereas the control electrode lid 30b rests on the two control electrode intermediate regions 30a. It is mentioned here that a thin oxide layer (oxide skin) may be formed on the surface of the semiconductor substrate 12.

With regard to functionality, the embodiment of FIGS. 2a and 2b correspond to the embodiment discussed referring to FIGS. 1a and 1b. Additionally, it is mentioned that the control electrode portion 22 does not necessarily need to be formed as a bending bar structure, but, exemplarily, may also be formed as a torsion plate.

Alternatively to the structural setup of the transistor structure 10 comprising a control electrode structure 20 in the form of a cantilever—or bridge structure—as shown in FIGS. 2a and 2b, the control electrode portion 22 may also be sealed hermetically in the edge region, such as, for example, by applying an oxide, such that a membrane is formed. It is, for example, possible using this membrane to perform pressure measurements relative to the internal pressure enclosed. The pressure measurement here may exemplarily take place in a gas environment or also in a liquid environment. Furthermore, a third control electrode base may alternatively be provided on a third side.

A method for manufacturing a transistor structure will be described below referring to FIGS. 3a to 3e.

Figure 3A:
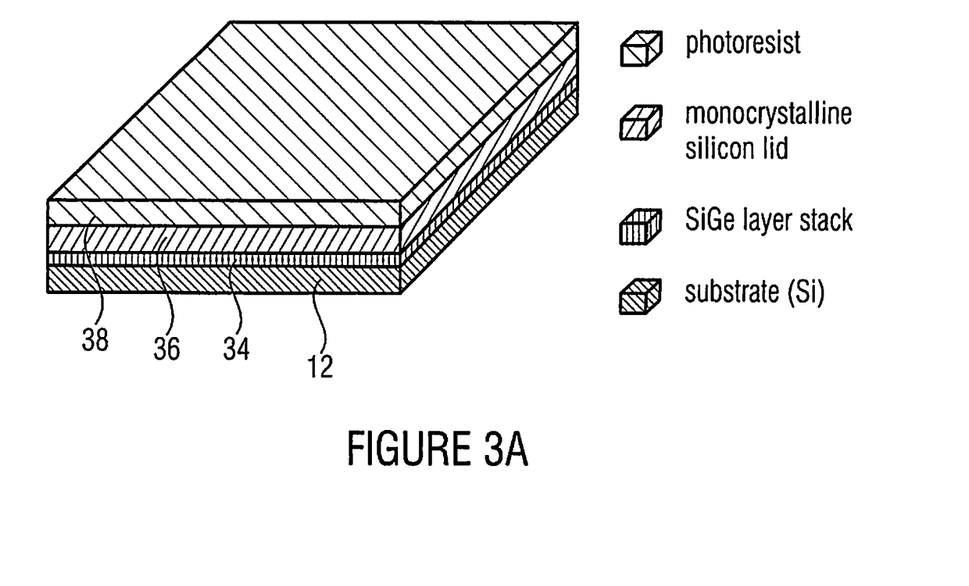
FIGS. 3a-e shows five schematic illustrations of five steps of a method for manufacturing the transistor structure in accordance with an embodiment.

FIG. 3a shows the starting situation of the present method for manufacturing the transistor structure including the substrate 12 and a control electrode intermediate layer 34, which will later on form the control electrode intermediate region 30a and exemplarily comprises silicon-germanium, such as, for example, with a germanium content of up to 10% or up to 30%. Another monocrystalline lid layer 36 which will later on form the control electrode lid 30b is applied onto this intermediate layer 34. Additionally, a photoresist 38 is applied onto this layer stack. It is to be noted here that in the phase of the manufacturing method illustrated, the first terminal region and the second terminal region and the channel region therebetween have already been introduced into the doped substrate 12.

A locally confined intermediate layer 34 which comprises a semiconductor connection material, such as, for example, a highly doped silicon-germanium material, is deposited epitaxially onto this doped substrate 12. After depositing the intermediate layer 34 which will later on serve as a sacrificial layer, the lid layer 36 is deposited epitaxially. Depositing may exemplarily take place sequentially and thus generate a sharp border, such as, for example, in the order of magnitude of 1 to 3 atomic layers (or 2 to 5 atomic layers) between the two layers 34 and 36. The sharp material transition between the semiconductor connection material (silicon-germanium) and the semiconductor material (pure silicon) or between the intermediate layer 34 and the lid layer 36 is, in correspondence with embodiments, achieved by reducing the germanium content in the epitaxial gas, such as, for example, $GeH_4$, or by completely switching off the germanium-doped gas when the intermediate layer 34 reaches the desired layer thickness, such that only pure or virtually pure silicon will then be grown epitaxially as the lid layer 36. It is mentioned here that this "pure" silicon lid layer 36 may comprise slight boron or phosphorus dopings. After growing the epitaxial layers which may exemplarily comprise an overall layer thickness of 0.5 μm (or a range between 0.1 μm and 5 μm), a photoresist 38 is applied onto the epitaxially applied layers 34 and 36 for the subsequent lithography process. It is of advantage here that, due to the identical electrode configuration, the lattice structure of the substrate 12 is continued in a structurally similar manner in the intermediate layer 34 or through the intermediate layer 34 up to the lid layer 36, however, mechanical or pseudomorphic tensing of the crystals in the (silicon-germanium) intermediate layer 34 taking place. This monocrystalline behavior including a limitation of potential lattice mismatching is possible up to a small layer thickness of, for example, 250 nm or 50 nm.

Figure 3B:
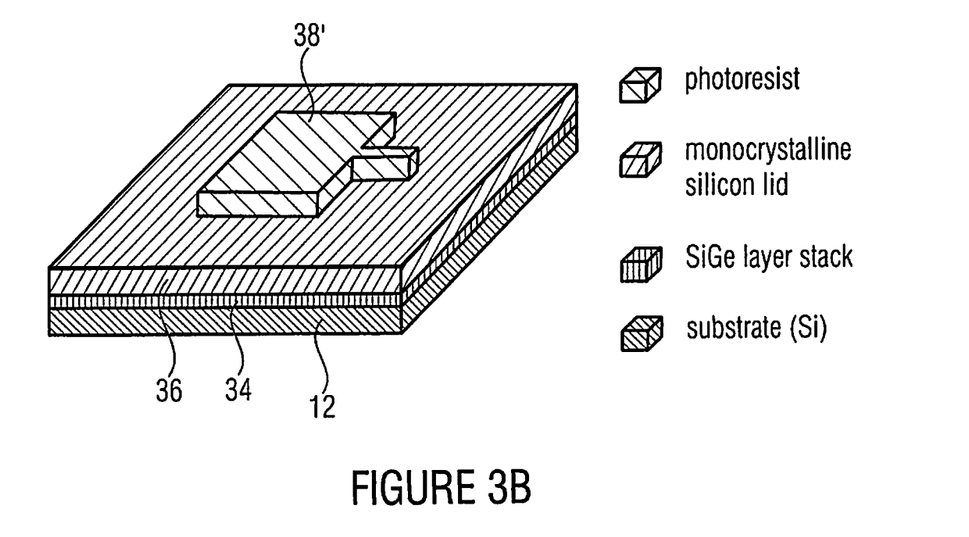

FIG. 3b illustrates the subsequent step of lithography. The photoresist 38' here has already been exposed and the regions of the photoresist 38 which are to be exposed by means of the subsequent etching process have been removed.

Figure 3C:
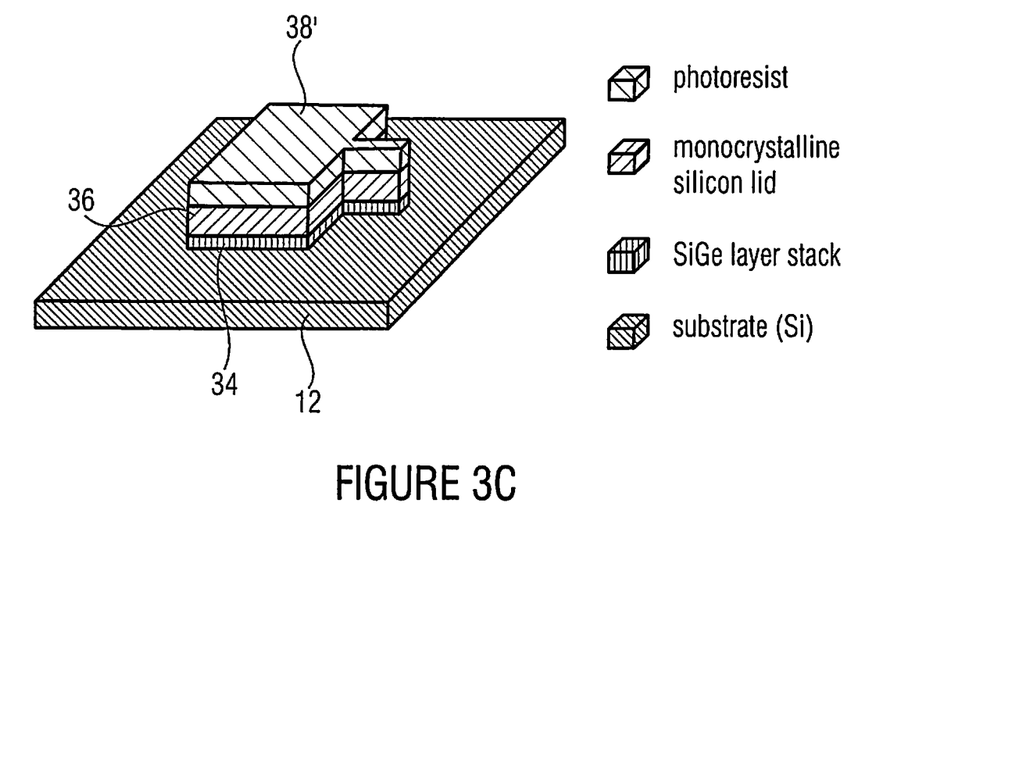

FIG. 3c illustrates the etching process just mentioned which exposes the structure at certain positions such that only the regions below the remaining photoresist 38' as a protective layer will remain on the substrate 12. These regions, i.e. the remaining region of the lid layer 36' and the remaining region of the intermediate layer 34', will later on form the control electrode structure 20.

Figure 3D:
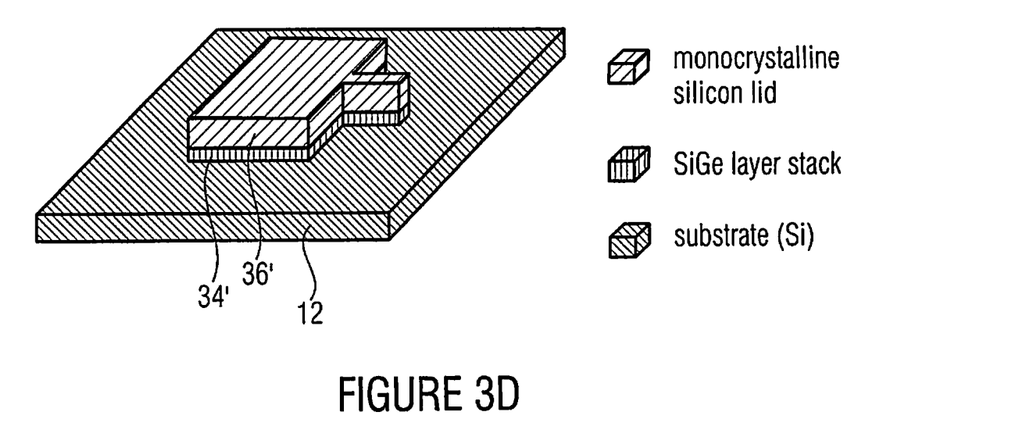

FIG. 3d shows the remaining regions of the intermediate layer 34' and the lid layer 36' after removing the photoresist.

Figure 3E:
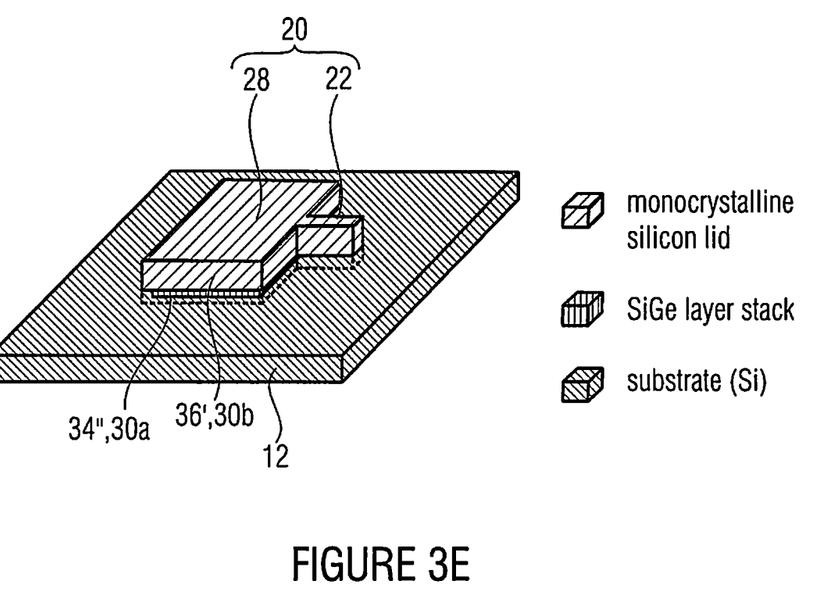

FIG. 3e illustrates the step in which the control electrode portion 22 of the control electrode structure is under-etched. This under-etching takes place by means of selectively etching the intermediate layer 30a, 34' which comprises the semiconductor connection material, like silicon-germanium. The semiconductor connection material comprises special semiconductor compounds which differ from other semiconductor materials by their band structure or bandgap and thus are etchable selectively. Compared to silicon, silicon-germanium comprises a smaller bandgap and thus a deviating work function, thereby resulting in a differing chemical behavior. Selectivities of 1:100 or even more can, for example, be achieved here. With selectively etching, the lid layer 36' is under-etched by roughly the factor of selectivity. An under-etched control electrode portion 22 with lateral dimensions of some micrometers, such as, for example, 10×2 μm, may be manufactured in this way. The gap or nanogap generated by etching is, for example, 20 nm. In order to have regions of the control electrode base 28, namely the control electrode intermediate region 30a, remain, the region of the control electrode base 28 is formed to be greater in the lateral dimensions compared to the control electrode portion 22. This means that under-etching of the control electrode base 28 takes place in the edge region, whereas, however, the control electrode portion 22 is under-etched completely. In this way, the under-etched lid layer 36' forms the control electrode lid 30b and 34'', respectively.

A plasma-assisted dry etching method or wet-chemical etching including suitable etching solutions or etching gasses may exemplarily be used for selective etching. With plasma-assisted dry etching, fluorine compounds allow selective etching of the silicon-germanium intermediate layer 34', for example by means of $CF_4/O_2$ microwave plasma. Selective etching is based on the existence of a difference in the bonding energy of germanium-silicon bonding, germanium-germanium bonding and silicon-silicon bonding. The fluorine radicals generated in the plasma are rather bonded to the germanium in the intermediate layer 34', thereby triggering a reaction which dissolves the bonding of germanium to neighboring atoms in the crystal lattice. Consequently, the neighboring atoms exhibit an unbound state (dangling bond) which may be saturated by further fluorine radicals. The fluorine radicals may, for example, be generated in the plasma using $CF_4$, $SF_6$ or $CF_2CL_2$ gasses. Volatile $GeF_4$ forms, which can be removed. Due to the vacancy formed and the dangling bonds generated, fluorine radicals are able to bond more readily to neighboring atoms, which may then, compared to the silicon in the lid layer 36', also be dissolved quicker.

Wet-chemical etching may be performed using sour or basic solutions. At first, the silicon-germanium is oxidized using an oxidant, such as, for example, $HNO_3$. The silicon-germanium oxide is then removed by another chemical compound, such as, for example, hydrofluoric acid (HF). It thus becomes tetrafluoride which is volatile.

Figure 4A:
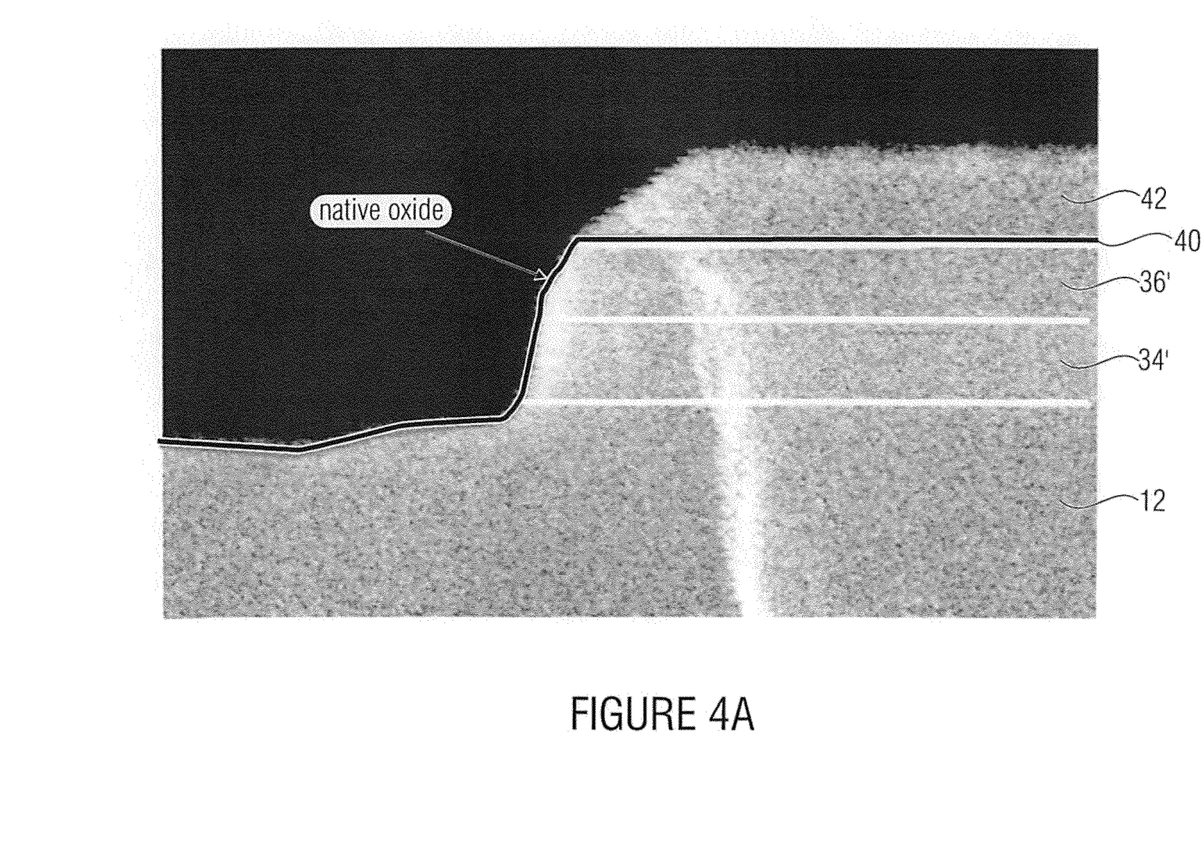
FIGS. 4a-b show sectional views of a transistor structure before and after etching for illustrating the manufacturing method in accordance with the embodiment of FIGS. 3a-e.
Figure 4B:
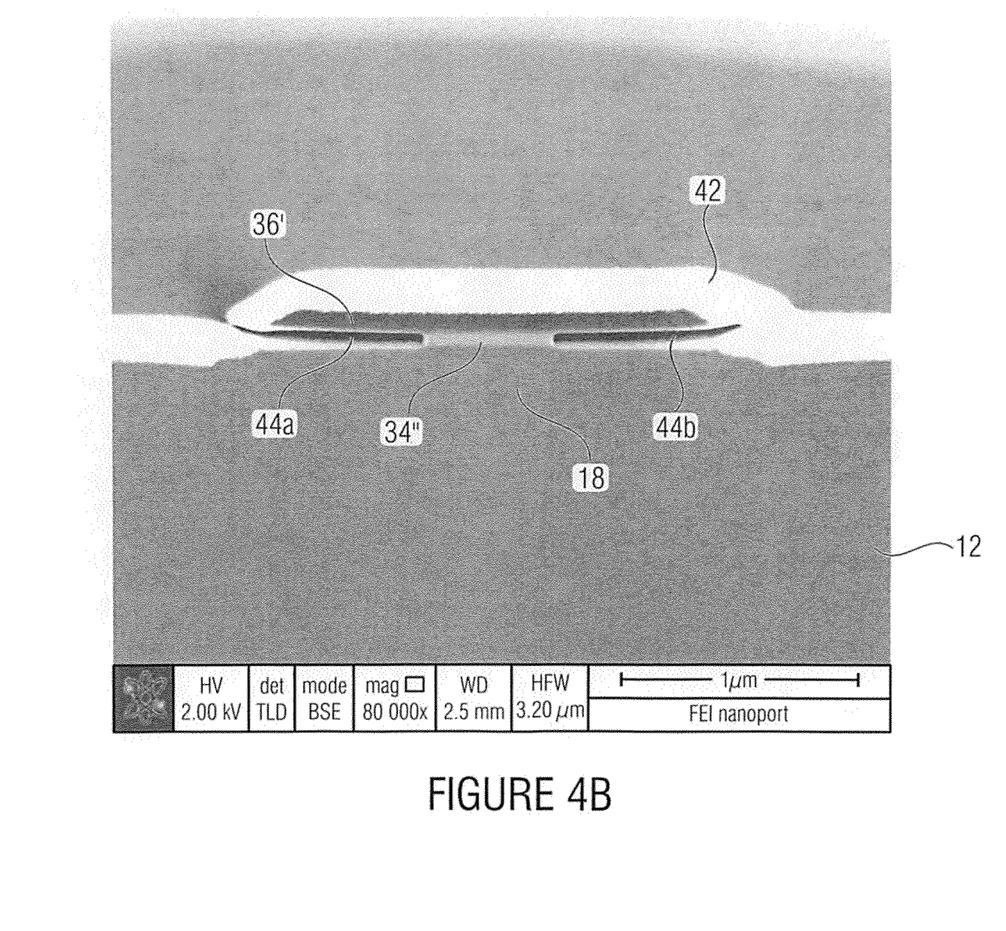

With regard to FIGS. 4a and 4b, two REM (Raster Electron Microscope) recordings are shown, in which a silicon/silicon-germanium/silicon layer stack is under-etched by means of a plasma-assisted dry etch method. FIG. 4a shows the layer stack before etching, whereas FIG. 4b shows the layer stack after etching. FIG. 4a shows the layer stack comprising the substrate 12, the intermediate layer 34' including silicon-germanium, and the lid layer 36' including silicon. Additionally, the layers are covered by a native oxide 40, wherein another nitride 42 is applied onto the layer stack or the native oxide layer 40 on the layer stack.

FIG. 4b shows the layer stack comprising the substrate 12, the intermediate layer 34'', the lid layer 36' and the nitride 42. Additionally, FIG. 4b shows the channel region 18 in the substrate 12, arranged below the lid layer 36'. The lid layer 36' is arranged such that two regions 44a and 44b etched free are formed between the channel region 18 and the lid layer 36'. Since the lid layer 36' is free to oscillate only in the region of the first region 44a etched free, i.e. is not covered completely by the nitride layer 42, the lid layer 36' may, for example, be used as an elastically deformable control electrode portion in this region. In order to use the lid layer 36' as the control electrode portion in the region of the second region 44b etched free, the nitride 42 may be opened in the region 44b by means of etching.

As an alternative to applying, as shown in FIGS. 3a and 3b, the intermediate layer in a patterned manner wherein at first the layer stack including the intermediate layer 34 and the lid layer 36 is applied before the patterned removal by means of lithography and etching technologies, patterned application may also be done by patterning the intermediate layer 34' and the lid layer 36' directly, i.e. applying same as is shown in FIG. 3c.

Additionally, it is to be mentioned that the material selected for the intermediate layer is not restricted to silicon-germanium materials. Other semiconductors, such as, for example, gallium, like in combination with carbon, or (monocrystalline) silicide in combination with copper, may also be employed.

In correspondence with further embodiments, the transistor structure may form a force-measuring system together with evaluating means connected to the first terminal region, the second terminal region and the control electrode portion. The evaluating means here is configured to establish a measuring signal, such as, for example, a current intensity or voltage between the first terminal region and the second terminal region, which is dependent on the distance between the control electrode portion and the channel region and, consequently, on the action of a force on the control electrode portion. Apart from the supply voltage applied between the first and second terminal regions, using the evaluating means, the supply voltage may be also be applied between the substrate or channel region and the control electrode portion.

The control electrode portion 22 may be biased statically using a force for trimming purposes. In correspondence with further embodiments, an imparting device is provided for this. This imparting device may be formed as a potential-free or potential-biasable structure. Exemplarily, the imparting device biases the control electrode portion 22 electronically by means of an electrical field. Same comprises another portion spaced apart therefrom associated with the control electrode portion 22, such as, for example, a further electrode, configured to generate an electrical bias between this further portion (in another layer) and the control electrode portion 22 and thus exert a force on the control electrode portion 22. The imparting device and the control electrode portion 22 are thus area-congruent, wherein it is mentioned that the imparting device, the control electrode portion 22 and, thus, the channel region 18 serving for scanning the control electrode portion 22 need not necessarily comprise equal areas.

When evaluating, static evaluation (compare above) and dynamic evaluation may be differentiated between. With dynamic evaluation, the control electrode portion 22 is operated in an oscillating state. It is noted that, in correspondence with further embodiments, a control electrode portion 22 may also be biased electrostatically in the oscillating state, which influences and detunes the resonant frequency and thus allows trimming. Excitation to oscillate may be done electrostatically by means of such an imparting device. An alternating voltage is applied here between the further portion and the control electrode portion 22. As an alternative to electrostatic excitation, the excitation may also be electromagnetic or thermal, as will be described in greater detail below. With electromagnetic excitation, a very thin conductive trace associated with the control electrode portion 22 is, for example, applied above or below same. If a current flows through this conductive trace, a magnetic field is generated, which excites the control electrode portion 22 to oscillate. Due to the very small distances in the transistor structure 10, the magnetic effect is sufficiently strong also with very small current intensities, in particular when the control electrode portion 22 comprises ferromagnetics. Ferromagnetic silicides which are comparatively strongly magnetic may, for example, be used here. Another way is exciting the control electrode portion 22 to oscillate thermally. This may, for example, be done by an external excitation by means of an LED or by means of a heating resistance doped into the control electrode portion 22.

With the control electrode portion 22 excited to oscillate periodically, signal evaluation is done by the control electrode portion 22 oscillating at resonant frequency. This excitation may exemplarily be controlled by the evaluating means, fed back with the signal sampled by the field-effect transistor 10. The evaluating means detects the resonant frequency which depends, on the one hand, on the geometry of the control electrode 20, its mass, and also on their mechanical conditions. The resonant frequency is shifted in particular by an occupation (or existence) of mass. This means that conclusions as to the occupation of mass may be drawn by shifting the resonant frequency. In other words, this means that the measuring process is transferred to the frequency-time behavior the transistor structure 10. Such a signal processing is of advantage in that zero position effects which exemplarily affect the distance $d_{22}$ by means of a superimposed force can be compensated selectively.

With regard to scaling, it is to be mentioned that the mechanical resonant frequency increases with a decreasing structural size of the transistor structure 10, which further improves scalability without any losses in sensitivity. In contrast, usually the amplitude and, consequently, sensitivity decrease with an increasing frequency. The scanning principle on the basis of a field-effect transistor used here compensates this fact in that sensitivity also increases with a small structural size, since only capacity normalized relative to the area is included in the transistor characteristic curve.

In correspondence with another embodiment, a chemically absorbing and/or adsorbing layer which selectively bonds predetermined particles and/or molecules from a gaseous environment may be applied onto the control electrode portion 22. The occupation of mass which is advantageously detectable dynamically, but also statically takes place by bonding the particles and/or molecules to the control electrode structure 22. This forms a highly sensitive chemical sensor which allows determining a concentration of selectively predetermined molecules or particles or personalizing ambient climatic measurements. The control electrode portion 22 may in correspondence with further embodiments be heatable such that the particles or molecules coupled may be removed again from the chemically absorbing or adsorbing layer, thus making the occupation of mass reversible.

In correspondence with further embodiments, the force-measuring system may comprise two transistor structures described above, one transistor structure being used for a direct force measurement or mass measurement and the second transistor structure serving as a reference. The second transistor structure here is, for example, enclosed by a hermetically sealing lid such that the control electrode portion 22 of the second transistor structure is not influenced by imparting the force or mass. In this embodiment, the evaluating means is configured for establishing the measuring signal by calculating a difference of the measuring signals of the first transistor structure (serving for a direct force measurement) and of the second measurement signal (serving as a reference). In accordance with further embodiments, more than two transistor structures may be arranged on a substrate such that a sensor array is formed, wherein the individual transistor structures are exemplarily configured for difference force regions or for different force directions.

Further applications are feasible due to the fact that, as described before, the transistor structure may be operated at resonant frequency. Here, the transistor structure may be used as a frequency standard (oscillator) or as a filter, comparable to SAW filters. Filters of this kind may be detuned slightly by a direct voltage applied with a mechanical offset causing a slight bending of the control electrode portion and thus be adjusted to the resonant frequency desired within tight limits. Due to the scalability of the transistor structure, mechanical frequencies in the upper megahertz range or above this range are possible. A bandpass filter may be realized by combining several filters of the same kind. It is of advantage here that these filters may also be manufactured by means of CMOS technologies and be integrated directly into CMOS elements.

Further examples of application of the transistor structure are, apart from micromechanical sensors or force-measuring systems, gyroscopes for recording accelerations, resonators and actuators. Another embodiment is as so-called "atomic force microscope" allowing a surface to be scanned mechanically at a most accurate resolution.

The core of the invention and, in particular, the advantages thereof will be summarized in other words below. Embodiments of the present invention relate to so-called "nanogap field-effect transistors" for measuring a quantity, such as, for example, a force or acceleration. High sensitivity of the sensor can be achieved here, since the scanning principle is based on the field-effect transistor. The nanogap field-effect transistor (NGFET) is similar in its setup to an MOSFET (Metal-Oxide Semiconductor Field-Effect Transistor). The difference between NGFET and MOSFET is an insulator between the control electrode portion 22 and the channel region 18, since the MOSFET has an insulator or dielectric, such as, for example, silicon dioxide, on which the gate rests, whereas the NGFET includes a cantilevered structure which is insulated either by a vacuum or a gas or a different medium. Manufacturing is based on an elastically deformable control electrode structure or a monocrystalline oscillating tongue acting as a gate electrode to be manufacturable by means of a very thin intermediate layer or sacrificial layer (such as, for example, a silicon-germanium sacrificial layer). Using the intermediate layer or sacrificial layer, the entire control electrode may comprise a monocrystalline atomic lattice structure allowing high physical reproducibility. The silicon-germanium sacrificial layer results in under-etching with a very small gap in the nanometer range to be usable. This very small gap results in high transistor amplification factors and small fringe effects. This manufacturing process is completely CMOS-compatible.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for manufacturing a transistor structure, comprising:
   producing a first terminal region, a second terminal region and a channel region therebetween in a semiconductor substrate;
   applying an intermediate layer comprising a semiconductor connection material onto the channel region in a patterned manner having a thickness such that a lattice structure of the semiconductor substrate is continued through the intermediate layer;
   applying a control electrode associated with the channel region onto the intermediate layer such that the lattice structure of the semiconductor substrate is continued into the control electrode; and selectively removing the intermediate layer such that a control electrode portion elastically deflectable under the action of a force is formed, wherein a distance between the control electrode portion and the channel region is changeable based on the action of the force, wherein the intermediate layer has a portion forming a part of the control electrode and a portion serving as a sacrificial layer to be removed during the step of the selectively removing, wherein applying the intermediate layer is performed by epitaxially depositing a silicon-germanium material and applying the control electrode is performed by epitaxially depositing a silicon material, wherein, when applying the control electrode, a germanium content of the silicon material to be applied is reduced compared to a germanium content when applying the intermediate layer, when reaching the desired thickness of the intermediate layer, and wherein selectively removing is performed by selectively etching the silicon-germanium material.

2. The method for manufacturing in accordance with claim 1, wherein applying the intermediate layer and applying the control electrode are performed by epitaxially depositing.

3. The method for manufacturing in accordance with claim 1, wherein applying the intermediate layer and applying the control electrode are performed such that the intermediate layer and the control electrode comprise a monocrystalline lattice structure.

4. The method for manufacturing in accordance with claim 1, wherein selectively removing is performed by wet-chemical etching or plasma-assisted dry-etching.

\* \* \* \* \*